(12) United States Patent
Kadota et al.

(10) Patent No.: US 10,617,048 B2
(45) Date of Patent: Apr. 7, 2020

(54) COMPONENT SUPPLIER AND COMPONENT SUPPLYING METHOD

(71) Applicant: Panasonic Intellectual Property Management Co., Ltd., Osaka (JP)

(72) Inventors: Syozo Kadota, Yamanashi (JP);
Hiroshi Matsumura, Yamanashi (JP);
Katsuhiko Itoh, Yamanashi (JP);
Makoto Nakashima, Yamanashi (JP);
Tadashi Endo, Yamanashi (JP);
Hiroyuki Fujiwara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 673 days.

(21) Appl. No.: 15/426,034

(22) Filed: Feb. 6, 2017

(65) Prior Publication Data

US 2017/0260032 A1 Sep. 14, 2017

(30) Foreign Application Priority Data

Mar. 10, 2016 (JP) .................................. 2016-046419
Mar. 10, 2016 (JP) .................................. 2016-046420

(51) Int. Cl.
*H05K 13/02* (2006.01)
*B60P 1/00* (2006.01)

(52) U.S. Cl.
CPC .............. *H05K 13/021* (2013.01); *B60P 1/00* (2013.01); *B62B 2203/10* (2013.01)

(58) Field of Classification Search
CPC ...... B65G 1/0435; B65G 1/06; B65G 49/061; B65G 49/064; H01L 21/67766; H01L 21/67778; H05K 13/0069; H05K 13/0084; H05K 13/021; H05K 13/0434; B66F 7/14; B66F 9/195; B62B 5/00; B62B 2203/70; B62B 2203/72
See application file for complete search history.

(56) References Cited

U.S. PATENT DOCUMENTS 3,398,844 A * 8/1968 Carlsson .................. B27N 3/22
414/277
6,036,425 A    3/2000 Seto
(Continued)

FOREIGN PATENT DOCUMENTS

JP    H10-270894 A    10/1998
JP    11-346091      12/1999
JP    2013-026403 A    2/2013

*Primary Examiner* — Glenn F Myers
(74) *Attorney, Agent, or Firm* — Pearne & Gordon LLP

(57) ABSTRACT

A component supplier of the present disclosure includes a magazine that stores pallets, a table that is provided in front of the magazine and is provided with a standby tables in multiple tiers in an up-and-down direction, a first lift that moves the table up and down, and a pallet supplier that is provided in front of the table and that includes a supply table which holds at least one of the pallets at a component supply position where the component is supplied. The table has a first placing and withdrawing unit that places and withdraws the pallet between the magazine and the standby tables and a second lift that moves the first placing and withdrawing unit up and down. The pallet supplier has a second placing and withdrawing unit that places and withdraws the pallet between the standby tables and the supply table.

5 Claims, 15 Drawing Sheets

(56) References Cited

U.S. PATENT DOCUMENTS

| | | | |
|---|---|---|---|
| 8,696,293 B2 * | 4/2014 | Tachibana | B65G 1/0435 414/20 |
| 2007/0035142 A1 * | 2/2007 | Yoshie | B65G 57/03 294/67.1 |

* cited by examiner

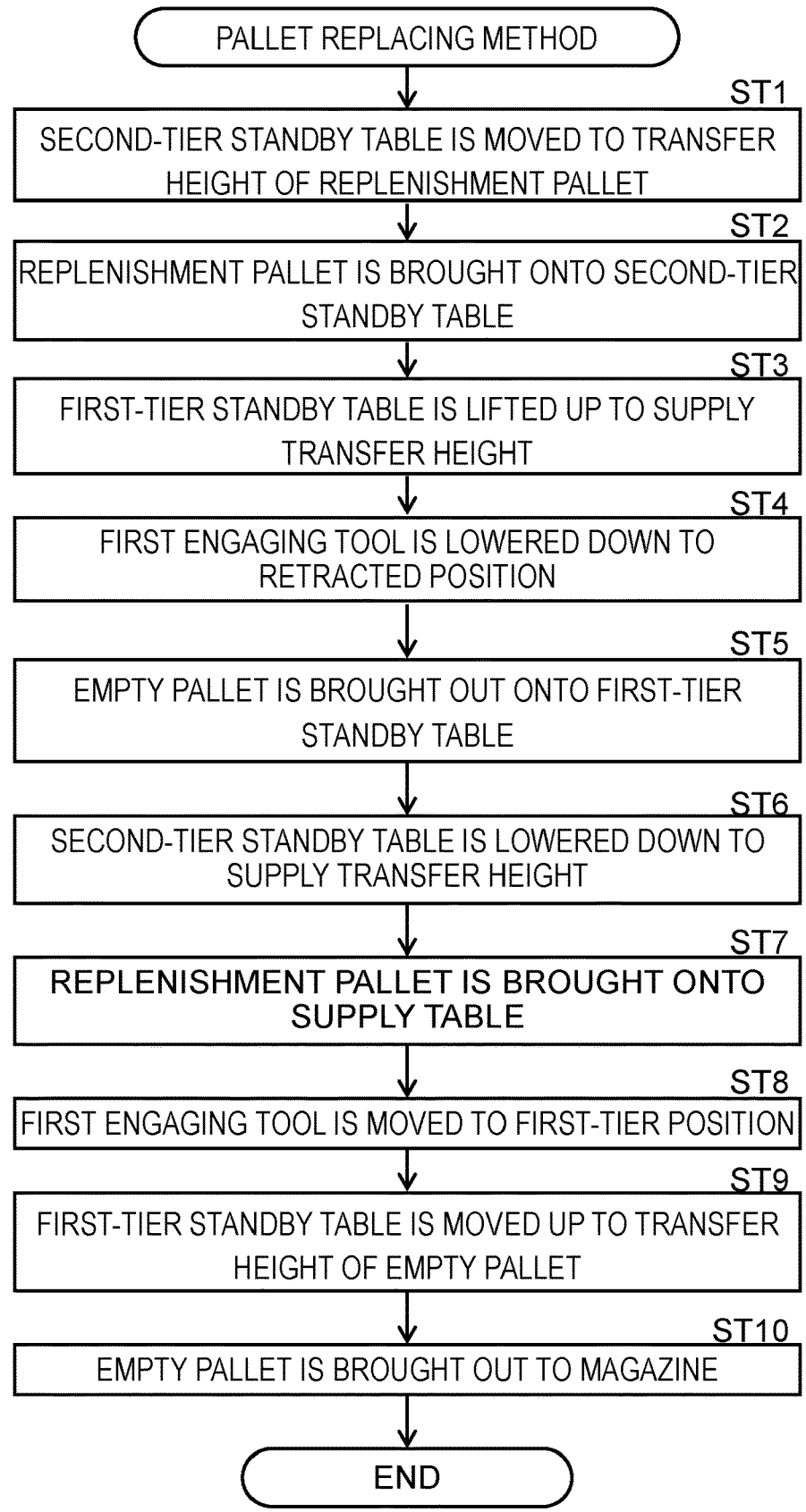

COMPONENT SUPPLIER AND COMPONENT SUPPLYING METHOD

BACKGROUND

1. Technical Field

The present disclosure relates to a component supplier and a component supplying method in which a tray that stores a component is picked up from a magazine and is moved to a component supply position.

2. Description of the Related Art

In the related art, a component supplier that picks up a pallet, on which a tray storing a plurality of components is installed, from a magazine, and moves the pallet to a component supply position, at which the components are picked up, in a component mounter is known (refer to PTL 1). The component supplier described in PTL 1 includes a table that has a plurality of first standby tables, which hold the pallet picked up from the magazine, in multiple tiers in an up-and-down direction, and a second standby table that holds, at the component supply position, the pallet received from the first standby table.

When replacing a pallet which supplies the components to the component mounter, first, an unused pallet, on which a tray storing components is installed, is withdrawn from the magazine and is left on standby on the plurality of first standby tables. Then, once a tray on the second standby table is emptied, this used pallet, on which the tray is installed, is recovered onto the empty first standby table, and the pallet which is on standby on the first standby table is withdrawn onto the second standby table.

CITATION LIST

Patent Literature

PTL 1: Japanese Patent Unexamined Publication No. 11-346091

SUMMARY

According to the present disclosure, a component supplier includes a magazine that stacks and stores a plurality of pallets on which a tray storing a component is installed, a table that is provided in front of the magazine and is provided with a plurality of standby tables in multiple tiers in an up-and-down direction, a first lift that moves the table up and down, and a pallet supplier that is provided in front of the table and that has a supply table which holds at least one of the plurality of pallets at a component supply position where the component is supplied. The table includes a first placing and withdrawing unit that places and withdraws the at least one of the plurality of pallets between the magazine and the plurality of standby tables, and a second lift that moves the first placing and withdrawing unit up and down. The pallet supplier includes a second placing and withdrawing unit that places and withdraws the at least one of the plurality of pallets between the plurality of standby tables and the supply table.

According to the present disclosure, there is provided a component supplying method for a component supplier including a table that is provided in front of a magazine which stacks and stores a plurality of pallets on which a tray storing a component is installed and that is provided with a plurality of standby tables in multiple tiers in an up-and-down direction, a first lift that moves the table up and down, and a pallet supplier that is provided in front of the table and that has a supply table which holds at least one of the plurality of pallets at a component supply position where the component is supplied, in which the pallet supplier has a second placing and withdrawing unit that places and withdraws the pallet between the plurality of standby tables and the supply table. The table includes a first placing and withdrawing unit that places and withdraws the at least one of the plurality of pallets between the magazine and the plurality of standby tables, and a second lift that moves the first placing and withdrawing unit up and down. The first placing and withdrawing unit moves up and down between the plurality of standby tables, and places and withdraws the at least one of the plurality of pallets between the magazine and each of the plurality of standby tables.

BRIEF DESCRIPTION OF THE DRAWINGS

FIG. 6 is a flow chart showing a pallet replacing method in the component supplier according to the exemplary embodiment of the present disclosure;

DETAILED DESCRIPTION

Prior to describing an exemplary embodiment of the present disclosure, problems of the device in the related art will be briefly described.

Since the component supplier described in the aforementioned PTL 1 has a withdrawing unit that withdraws a pallet from a magazine to each of a plurality of first standby tables, the size of the table increases. Thus, the component supplier has a problem of an increased size since the component supplier has to lift and lower the even larger table in an up-and-down direction.

Exemplary Embodiment

Figure 1:
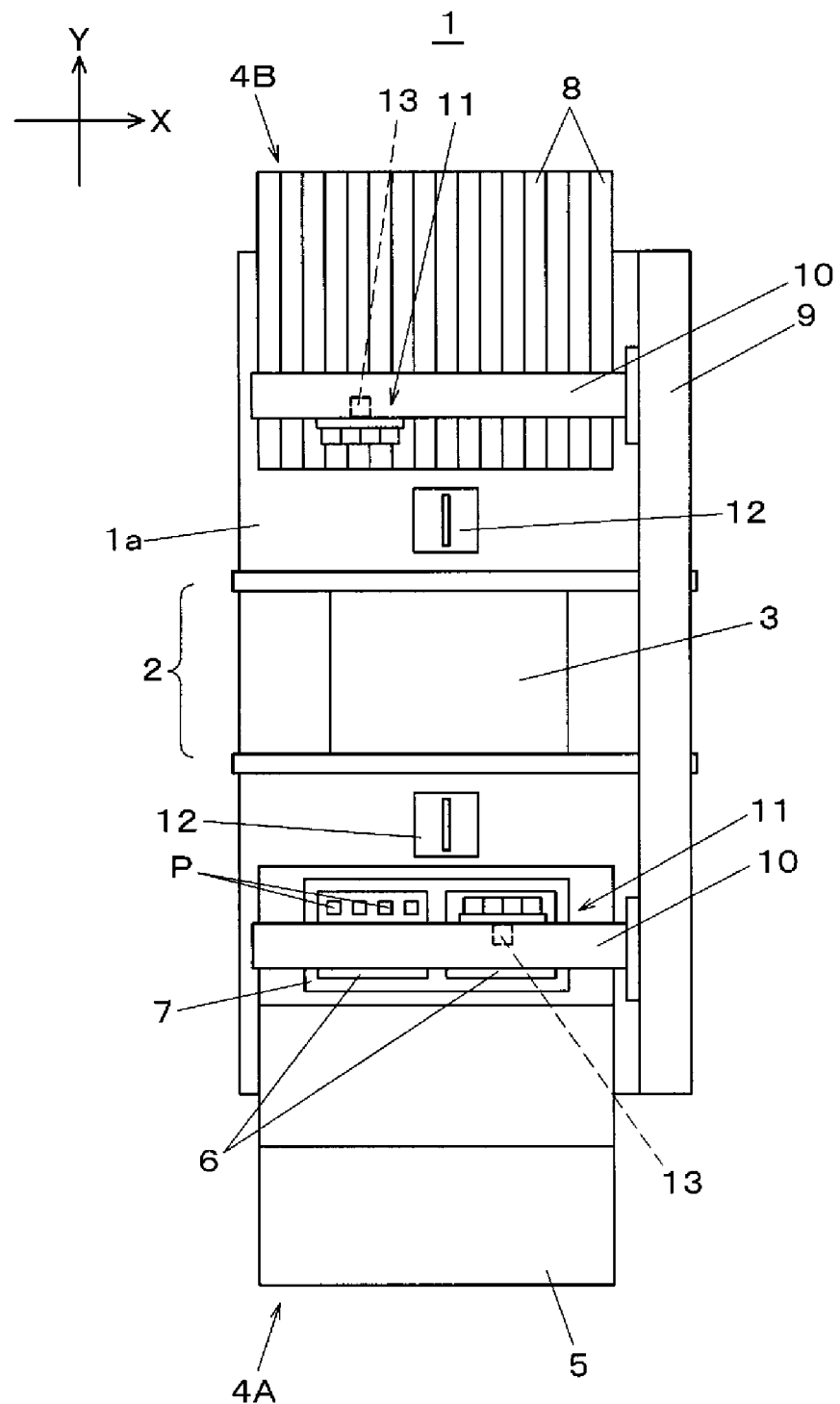
FIG. 1 is a plan view of a component mounter, according to an exemplary embodiment of the present disclosure, in which a component supplier is installed.
Figure 2:
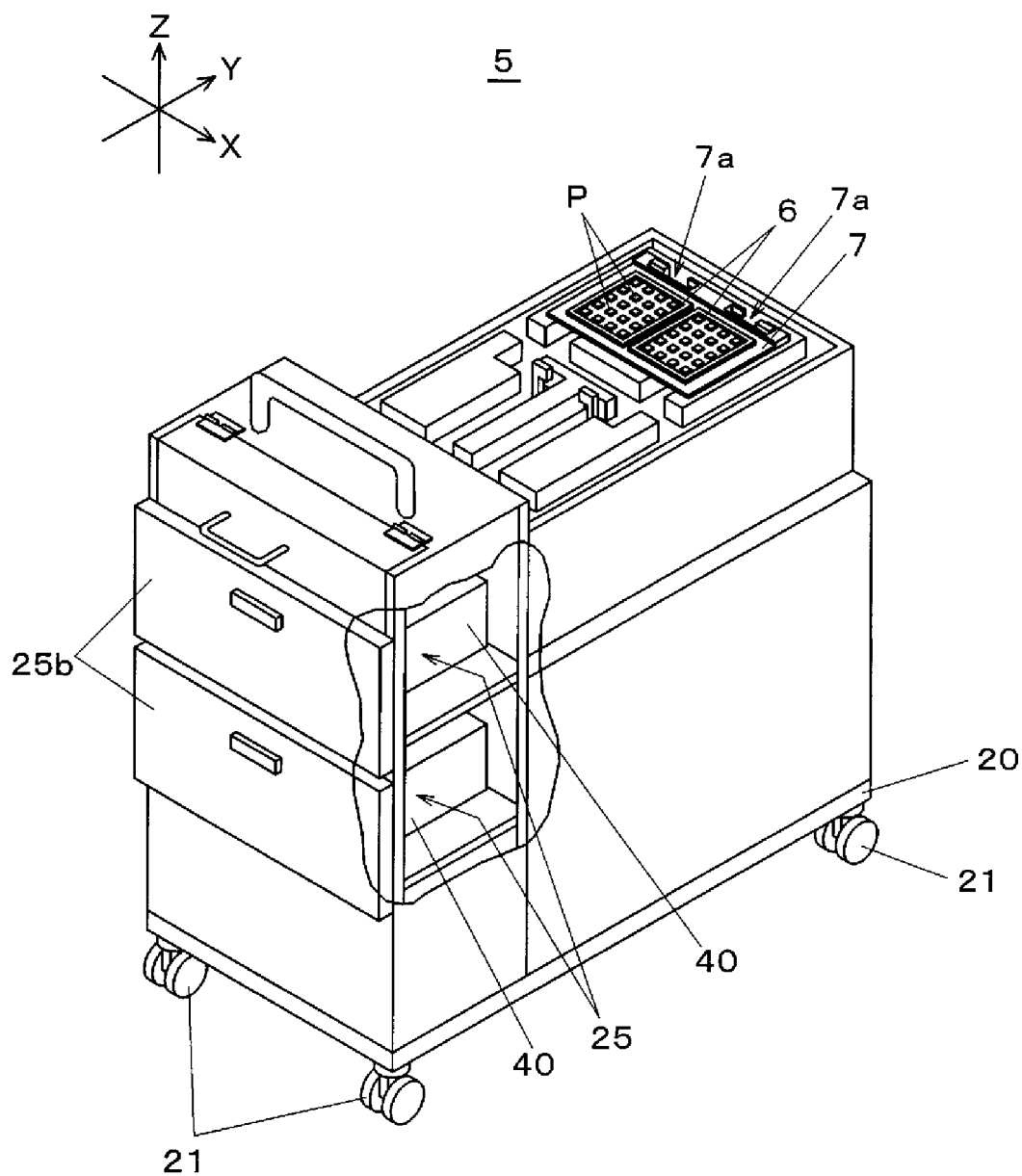
FIG. 2 is a perspective view of the component supplier according to the exemplary embodiment of the present disclosure.

Hereinafter, an exemplary embodiment of the present disclosure will be described in detail with reference to the drawings. Configurations, shapes, and the like that will be described below are examples for description, and changes can be appropriately made according to specifications of a component mounter and a component supplier (tray feeder). Hereinafter, the same reference numerals will be assigned to the same elements in all the drawings, and the same description will not be repeated. In FIG. 1 and a part which will be described later, an X-direction (right-and-left direction in FIG. 1), which is a board transporting direction, and a Y-direction (an up-and-down direction in FIG. 1), which is orthogonal to the board transporting direction, are illustrated as two axial directions orthogonal to each other on the horizontal plane. In FIG. 2 and a part which will be described later, a Z-direction is illustrated as a height direction orthogonal to the horizontal plane. The Z-direction is an up-and-down direction or an orthogonal direction in a case where the component mounter is provided on the horizontal plane.

First, a configuration of component mounter 1 will be described with reference to FIG. 1. In FIG. 1, board transport mechanism 2 is arranged in the X-direction on an upper surface of base 1a. Board transport mechanism 2 transports board 3, which is a target for component mounting. Board transport mechanism 2 is positioned at a working position of a component mounting mechanism, which will be described later, and holds board 3. On both sides of board transport mechanism 2, component supplying units 4A and 4B that supply a component to be mounted on board 3 are arranged.

In component supplying unit 4A, component supplier 5 (tray feeder) is disposed. Component supplier 5 moves pallet 7, on which (herein, two) trays 6 storing component P in a grid array are installed, to a component supply position at which component P is supplied to the component mounting mechanism that will be described later. In component supplying unit 4B, a plurality of tape feeders 8 are disposed in parallel. Tape feeder 8 supplies component P to the component mounting mechanism by pitch-feeding a carrier tape that holds component P.

Y-axis beam 9 provided with a linear drive mechanism is arranged on one side end of the upper surface of base 1a in the X-direction. Two X-axis beams 10 provided with the same linear drive mechanism are coupled to Y-axis beam 9 so as to move freely in the Y-direction. Mounting head 11 is installed in each of two X-axis beams 10 so as to move freely in the X-direction. Mounting head 11 is a multiple-type head provided with a plurality of holding heads, and a suction nozzle that sucks component P is installed on an lower end of each of the holding heads.

By Y-axis beam 9 and X-axis beam 10 being driven, mounting head 11 moves horizontally (the X-direction and the Y-direction) between component supplying units 4A and 4B and board 3 held by board transport mechanism 2, and picks up, by means of the suction nozzle, component P supplied by component supplying units 4A and 4B to mount component P on board 3. Thus, Y-axis beam 9, X-axis beam 10, and mounting head 11 configure the component mounting mechanism that mounts component P on board 3 by means of the suction nozzle.

Component recognition camera 12 is arranged between component supplying units 4A and 4B and board transport mechanism 2. Component recognition camera 12 images component P held by mounting head 11 when mounting head 11 that has picked up component P from component supplying units 4A and 4B moves above component recognition camera 12. Accordingly, component P held by mounting head 11 is identified and the position thereof is recognized. In mounting head 11, each board recognition camera 13 that is on a lower surface side of X-axis beam 10 and moves integrally with mounting head 11 is installed. By mounting head 11 being moved, board recognition camera 13 moves above board 3 positioned and held by board transport mechanism 2 to image board 3. Accordingly, the position of board 3 is recognized.

Hereinafter, a configuration of component supplier 5 will be described with reference to FIGS. 2 to 4. Component supplier 5 is provided with carriage 20 that moves freely by means of wheels 21 on a work floor. Rack 22, pallet standby unit 23, and pallet supplier 24 are provided on an upper surface of carriage 20. A plurality of (herein, two) magazine holders 25 that store magazine 40, in which pallet 7 is stacked and stored, are arranged in the up-and-down direction in rack 22. Tray 6 storing component P is installed on pallet 7.

Corresponding to magazine input and output port 25a of each magazine holder 25, door 25b that opens freely (arrow a in FIG. 3) in the up-and-down direction is provided on a side of rack 22 where a user performs an operation. In a state where magazine input and output port 25a is opened by door 25b being opened (upper side in FIG. 3), magazine 40 is inserted or removed in a horizontal direction through magazine input and output port 25a corresponding to door 25b. Once door 25b is closed, magazine input and output port 25a corresponding to this door 25b is shut (state of lower side in FIG. 3). As described above, rack 22 has the plurality of magazine holders 25 arranged in the up-and-down direction. Magazine holder 25 holds magazine 40 inserted in the horizontal direction through magazine input and output port 25a corresponding to each magazine holder 25.

Figure 3:
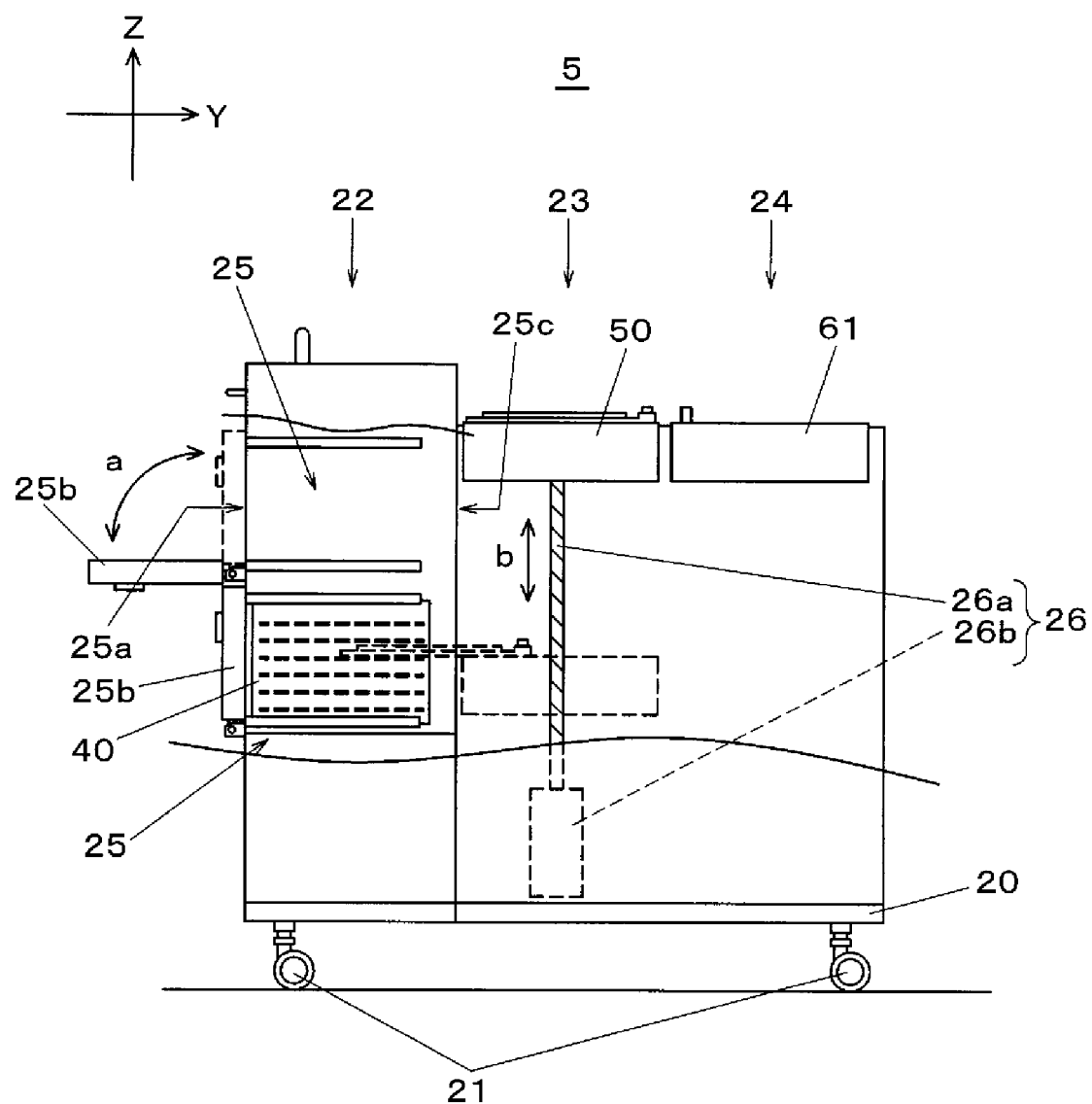
FIG. 3 is a configuration explanatory view of the component supplier according to the exemplary embodiment of the present disclosure.

In FIG. 3, pallet standby unit 23 is provided in front of rack 22 (on a side opposite to the side where the user performs an operation), and is provided with table 50 and first lifting mechanism 26. First lifting mechanism 26 has ball screw 26a extended in the up-and-down direction and motor 26b that rotation-drives ball screw 26a. First lifting mechanism 26 drives motor 26b to lift and lower (arrow b) table 50. That is, first lifting mechanism 26 is a first lift that moves table 50 up and down.

Figure 4:
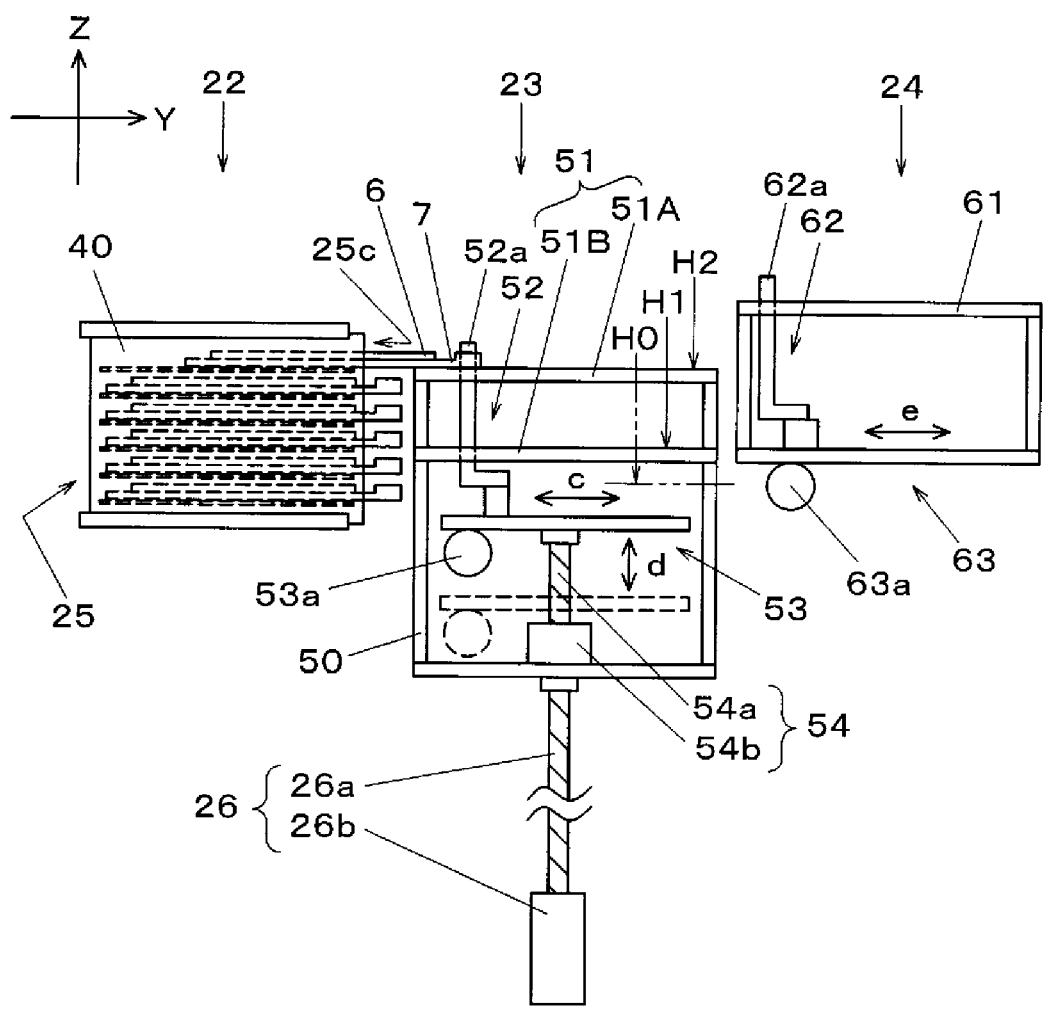
FIG. 4 is a partial configuration explanatory view of the component supplier according to the exemplary embodiment of the present disclosure.

In FIG. 4, table 50 is provided with standby table 51, first engaging mechanism 52, and second lifting mechanism 54. Transferred pallet 7 is held by an upper surface of standby table 51. A plurality of (herein, two) standby tables 51 are arranged in the up-and-down direction on table 50. Hereinafter, out of two standby tables 51, upper one will be referred to as second-tier standby table 51A, and lower one will be referred to as first-tier standby table 51B.

First engaging mechanism 52 is provided with first engaging tool 52a and first moving mechanism 53. First moving mechanism 53 has motor 53a, and moves first engaging tool 52a in a front-and-back direction (arrow c) by driving motor 53a. Second lifting mechanism 54 has ball screw 54a extended in the up-and-down direction and motor 54b that rotation-drives ball screw 54a. Second lifting mechanism 54 drives motor 54b to lift and lower (arrow d) first engaging mechanism 52. That is, second lifting mechanism 54 is a second lift that moves first engaging mechanism 52 (first placing and withdrawing unit) up and down.

By moving first engaging mechanism 52 up and down, second lifting mechanism 54 positions first engaging tool 52a at second-tier position H2, which is the upper surface of second-tier standby table 51A, at first-tier position H1, which is the upper surface of first-tier standby table 51B, and at retracted position H0, which is a position below first-tier standby table 51B.

Placing and withdrawing of pallet 7 between magazine 40 and second-tier standby table 51A is performed as follows. First, table 50 positions first engaging tool 52a at second-tier position 112. Then, first lifting mechanism 26 positions second-tier standby table 51A at a transfer height in front of magazine 40 (specifically, in front of pallet pick-up port 25c corresponding to magazine holder 25 holding this magazine 40) in which pallet 7 to be picked up is stored.

Then, table 50 moves first engaging tool 52a to pallet pick-up port 25c (direction of magazine 40), and engages first engaging tool 52a with engaging portion 7a provided in front of pallet 7. By moving first engaging tool 52a forward in this state, table 50 withdraws pallet 7 to second-tier standby table 51A (refer to FIG. 5A as well). In addition, table 50 stores pallet 7 within magazine 40 by moving first engaging tool 52a to pallet pick-up port 25c (direction of magazine 40) in a state where first engaging tool 52a is engaged with engaging portion 7a.

In addition, the placing and withdrawing of pallet 7 between magazine 40 and first-tier standby table 51B is performed similarly in a state where first engaging tool 52a is positioned at first-tier position H1. As described above, table 50 is provided in front of magazine 40, and is provided with the plurality of standby tables 51 (second-tier standby table 51A and first-tier standby table 51B). In addition, table 50 has first engaging mechanism 52 (first placing and withdrawing unit) to which pallet 7 is placed and from which pallet 7 is withdrawn between magazine 40 and standby table 51 and second lifting mechanism 54 (second lift) that moves first engaging mechanism 52 up and down. Accordingly, pallet 7 (tray 6) can be efficiently replaced without causing an increase in the size of component supplier 5.

In FIG. 4, pallet supplier 24 is provided in front of pallet standby unit 23 (on the side opposite to the side where the user performs an operation), and is provided with supply table 61 and second engaging mechanism 62. Supply table 61 holds pallet 7 received from second-tier standby table 51A or first-tier standby table 51B of table 50 at the component supply position where component P is supplied. Second engaging mechanism 62 is provided with second engaging tool 62a and second moving mechanism 63. Second moving mechanism 63 has motor 63a, and moves second engaging tool 62a in the front-and-back direction (arrow e) by driving motor 63a.

Figure 5A:
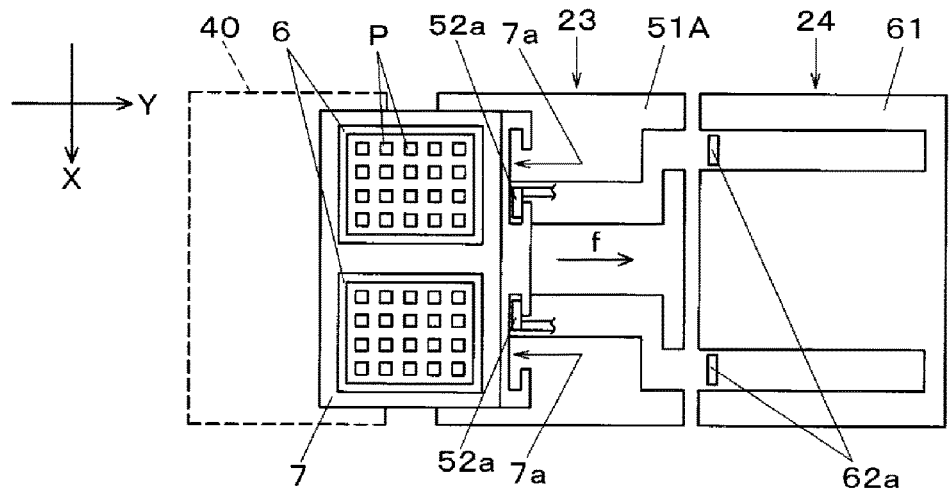
FIG. 5A is a process diagram illustrating a method for transferring a pallet to a component supply position in the component supplier according to the exemplary embodiment of the present disclosure.

Hereinafter, operation of pallet standby unit 23 and pallet supplier 24 up until pallet 7 stored in magazine 40 is picked up and moved to the component supply position of supply table 61 will be described with reference to FIG. 5A to FIG. 5C. Herein, pallet standby unit 23 withdrawing pallet 7 to second-tier standby table 51A will be described as an example. First, as illustrated in FIG. 5A, pallet standby unit 23 positions first engaging tool 52a at second-tier position H2, moves second-tier standby table 51A to the transfer height of pallet 7 to be picked up, and engages first engaging tool 52a with engaging portion 7a of pallet 7 to withdraw (arrow f) pallet 7.

Figure 5B:
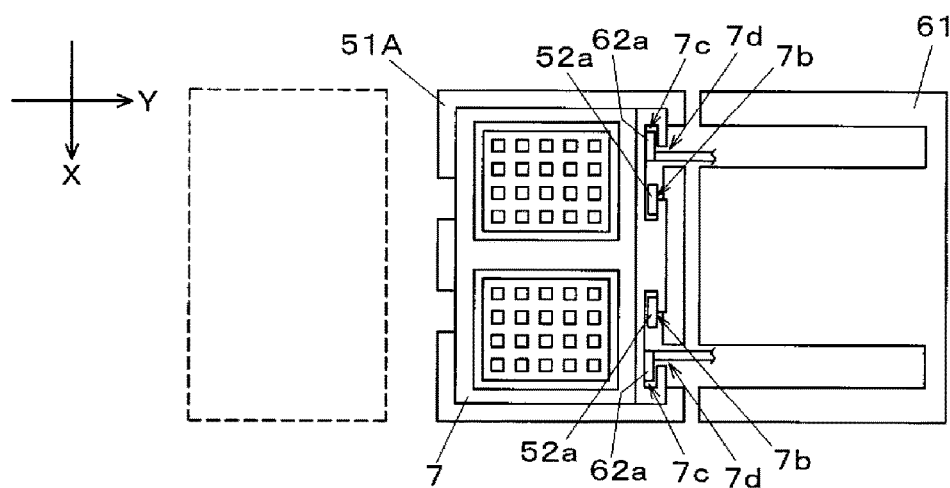
FIG. 5B is a process diagram illustrating the method for transferring the pallet to the component supply position in the component supplier according to the exemplary embodiment of the present disclosure.
Figure 5C:
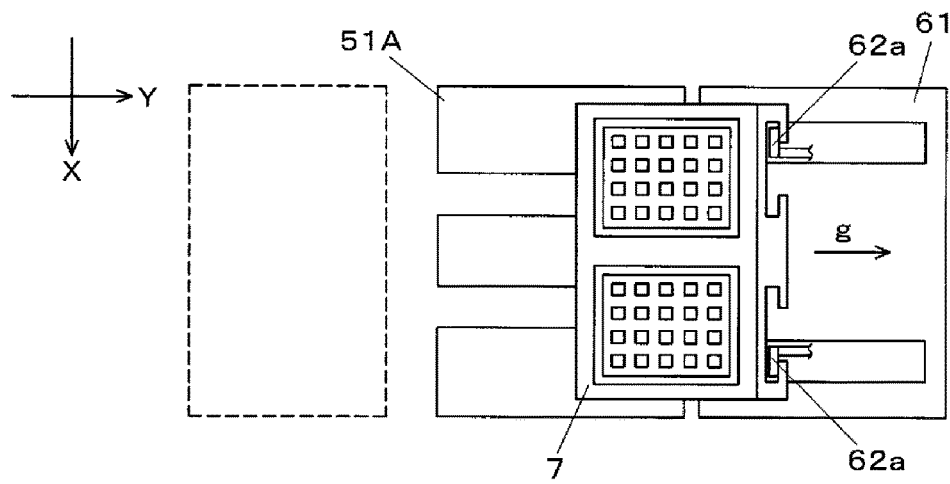
FIG. 5C is a process diagram illustrating the method for transferring the pallet to the component supply position in the component supplier according to the exemplary embodiment of the present disclosure.

Then, as illustrated in FIG. 5B, pallet standby unit 23 moves second-tier standby table 51A to the supply transfer height of supply table 61 once pallet 7 is moved to the second-tier standby position of second-tier standby table 51A. In this state, pallet supplier 24 engages engaging portion 7a with second engaging tool 62a. After then, pallet standby unit 23 lowers first engaging tool 52a to first-tier position H1 or retracted position H0 at which first engaging tool 52a does not interfere with pallet 7 that moves in the front-and-back direction. Then, as illustrated FIG. 5C, pallet supplier 24 moves (arrow g) second engaging tool 62a to move pallet 7 to the component supply position.

In this example, two engaging portions 7a, two first engaging tools 52a, and two second engaging tools 62a are provided. First engaging position 7b at which first engaging tool 52a is engaged and second engaging position 7c at which second engaging tool 62a is engaged are provided in each of engaging portions 7a. Accordingly, even in a state where first engaging tool 52a and second engaging tool 62a are simultaneously engaged with engaging portion 7a, first engaging tool 52a and second engaging tool 62a do not interfere with each other. Furthermore, clearance 7d, which is obtained by a portion extending from engaging portion 7a to an outer periphery being cut out, is provided in each engaging portion 7a. Accordingly, even when pallet 7 and first engaging tool 52a or second engaging tool 62a move up and down with respect to each other in a state where first engaging tool 52a or second engaging tool 62a is positioned at engaging portion 7a, the two do not interfere with each other.

As described above, pallet supplier 24 has supply table 61 that holds pallet 7 at the component supply position where component P is supplied, and is provided in front of table 50. In addition, pallet supplier 24 has second engaging mechanism 62 (second placing and withdrawing unit) that places and withdraws pallet 7 between standby table 51 (second-tier standby table 51A and first-tier standby table 51B) and supply table 61.

Hereinafter, a configuration of a control system of component supplier 5 will be described. Component supplier 5 is provided with controller 30 and storage 31. Based on a work parameter stored in storage 31, controller 30 controls motor 26b, motor 53a, motor 54b, and motor 63a to execute the replacement of pallet 7 at the component supply position.

In a state where component supplier 5 is installed in component mounter 1, controller 30 is connected to a mounting controller (not illustrated) provided in component mounter 1. Controller 30 supplies component P required by component mounter 1 to the component supply position by exchanging a signal with the mounting controller.

Figure 7A:
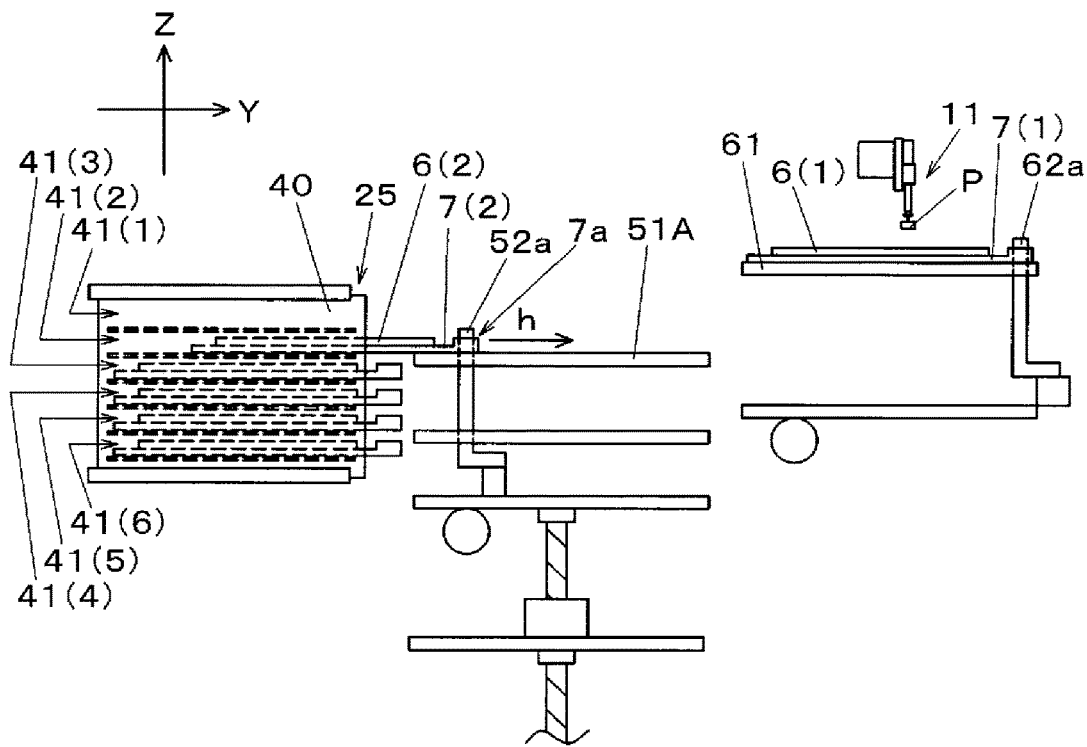
FIG. 7A is a process diagram illustrating the pallet replacing method in the component supplier according to the exemplary embodiment of the present disclosure.
Figure 7B:
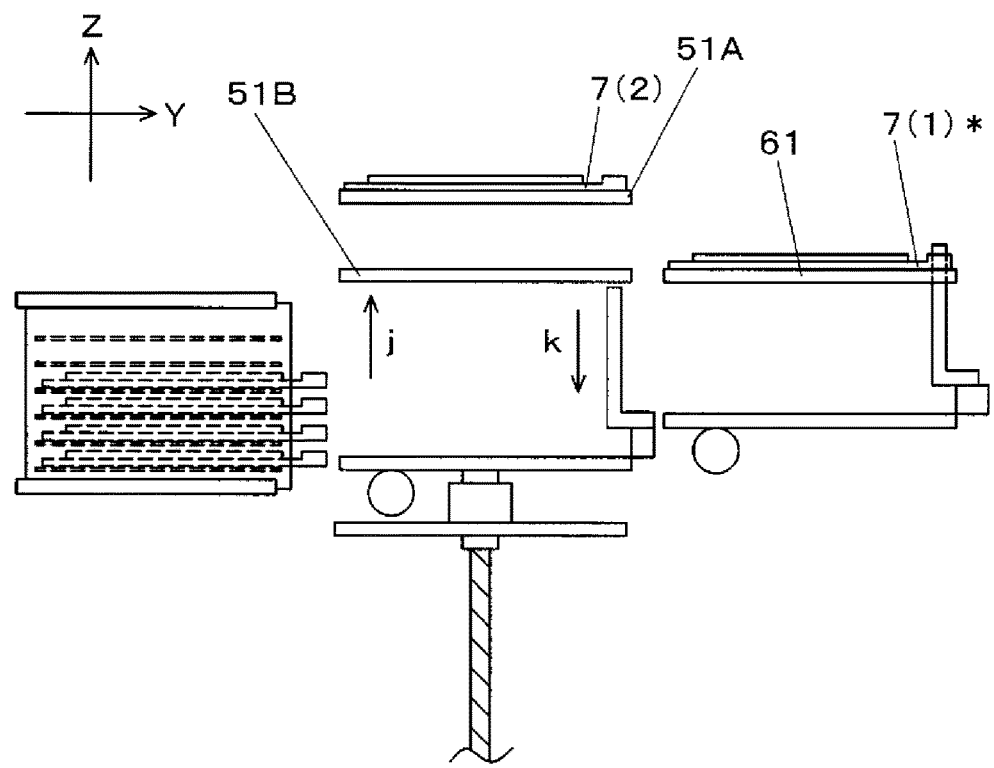
FIG. 7B is a process diagram illustrating the pallet replacing method in the component supplier according to the exemplary embodiment of the present disclosure.
Figure 8A:
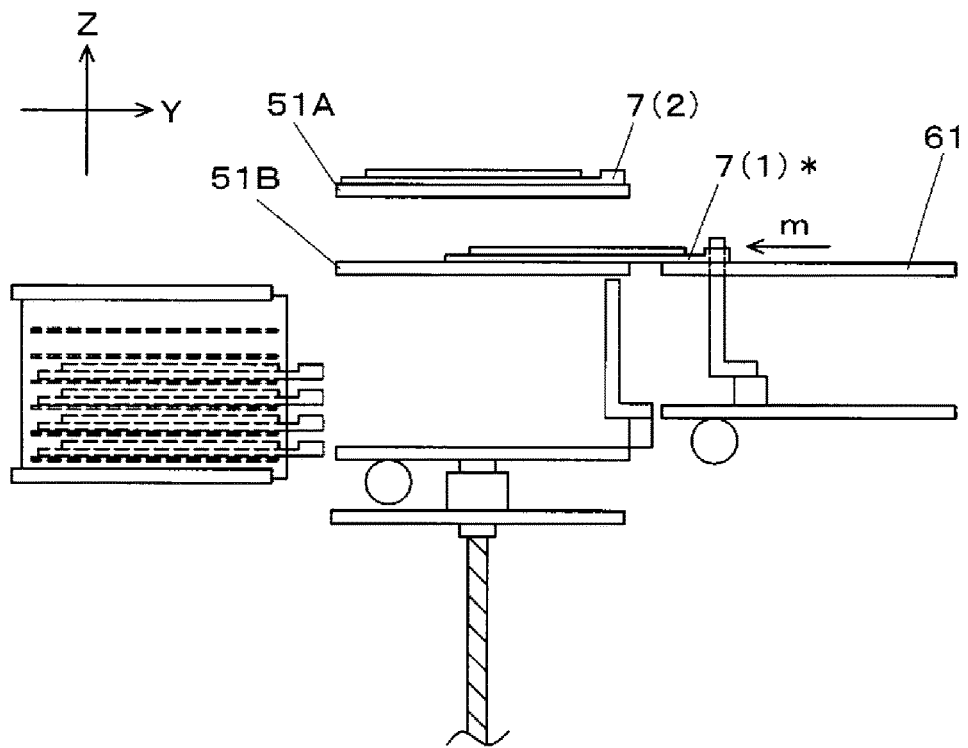
FIG. 8A is a process diagram illustrating the pallet replacing method in the component supplier according to the exemplary embodiment of the present disclosure.
Figure 8B:
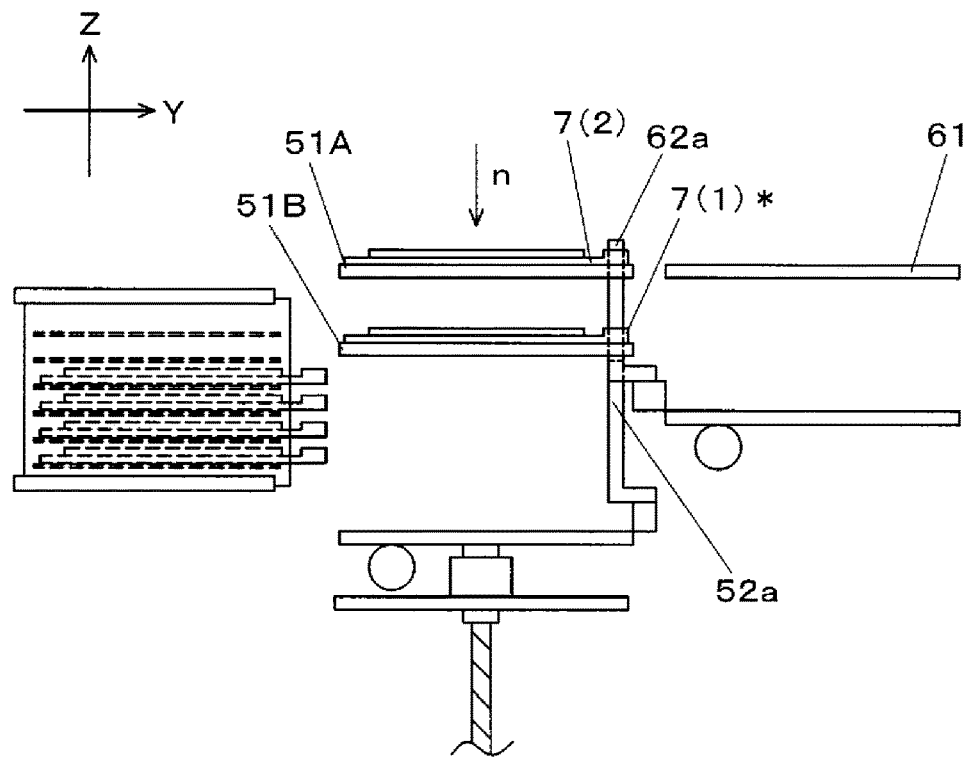
FIG. 8B is a process diagram illustrating the pallet replacing method in the component supplier according to the exemplary embodiment of the present disclosure.
Figure 9A:
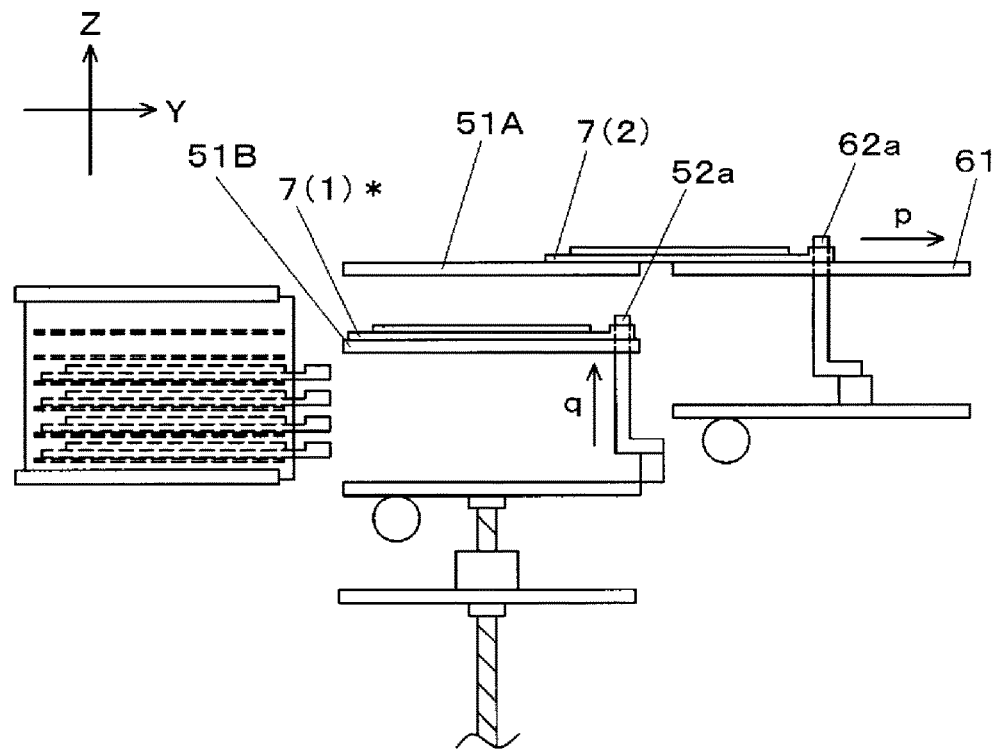
FIG. 9A is a process diagram illustrating the pallet replacing method in the component supplier according to the exemplary embodiment of the present disclosure.
Figure 9B:
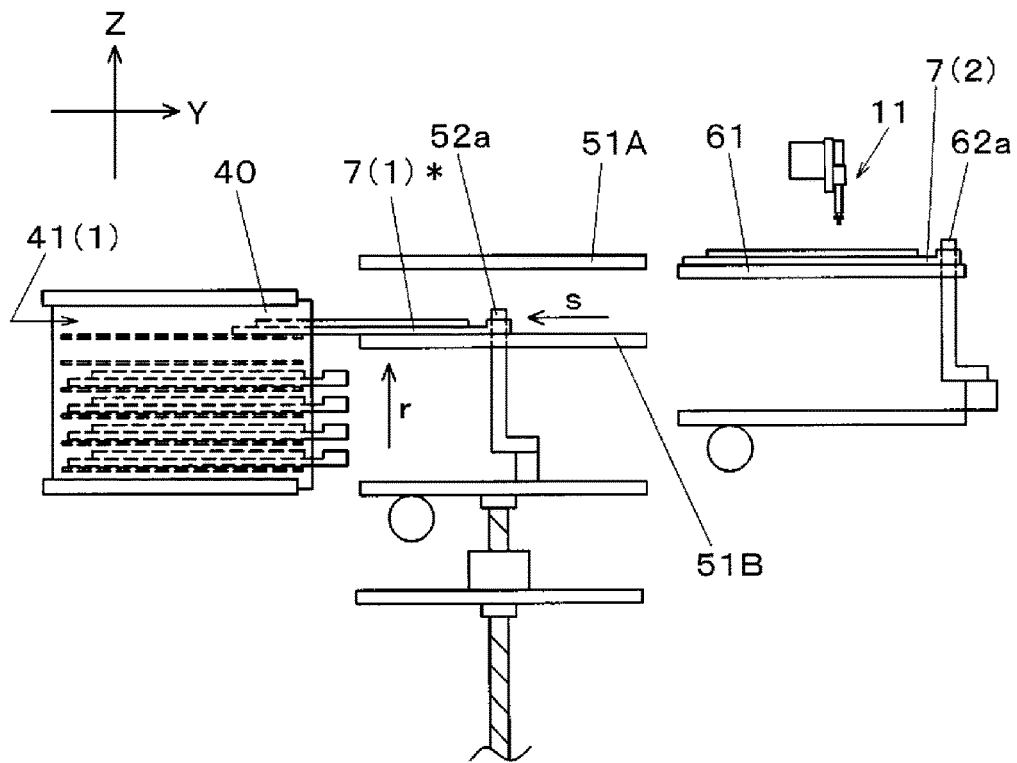
FIG. 9B is a process diagram illustrating the pallet replacing method in the component supplier according to the exemplary embodiment of the present disclosure.

Hereinafter, with reference to FIG. 7A to FIG. 9B, a pallet replacing method (component supplying method) in which component P is supplied while replacing pallet 7 supplied to the component supply position in component supplier 5 will be described in accordance with a flow of FIG. 6. In FIG. 7A, six tiers of shelves 41(1) to 41(6) are provided in the up-and-down direction in magazine 40 held by magazine holder 25. In addition, at the component supply position of supply table 61, pallet 7(1) picked up from uppermost shelf 41(1) is held, and component P is continued to be picked up, by mounting head 11, from tray 6(1) installed on pallet 7(1).

The pallet replacing method will be described. In the pallet replacing method, from the above state, pallet 7(1), on which tray 6(1) is installed, is emptied of all components P by being picked up, and pallet 7(2) for component replenishment, on which tray 6(2) storing component P is installed, is stored onto second shelf 41(2) from the top. In addition, pallet 7(1) (hereinafter, referred to as "empty pallet 7(1)*".) is replaced with pallet 7(2) for component replenishment (hereinafter, referred to as "replenishment pallet 7(2)".).

In FIG. 6, first engaging tool 52a is moved to second-tier position H2, and second-tier standby table 51A is moved to the transfer height at which replenishment pallet 7(2) is withdrawn from shelf 41(2) (ST1). Then, first engaging tool 52a is engaged with engaging portion 7a of replenishment pallet 7(2), and replenishment pallet 7(2) is brought onto (arrow h of FIG. 7A) second-tier standby table 51A (ST2). Then, first-tier standby table 51B is lifted up to (arrow j of FIG. 7B) the supply transfer height at which pallet 7 is exchanged between first-tier standby table 51B and supply table 61 (ST3). Then, first engaging tool 52a is lowered to (arrow k of FIG. 7B) retracted position H0 (ST4). In this state, standby continues until component P on tray 6(1) of pallet 7(1) is picked up, and tray 6(1) is emptied.

Lowering first engaging tool 52a (ST4) may be executed in parallel with lifting first-tier standby table 51B (ST3). That is, up-and-down movement of table 50 performed by first lifting mechanism 26 (first lift) and up-and-down movement of first engaging mechanism 52 (first placing and withdrawing unit) performed by second lifting mechanism 54 (second lift) may be carried out independently of each other. Accordingly, pallet 7 can be efficiently replaced.

In FIG. 6, once component P on tray 6(1) of pallet 7(1) is emptied, empty pallet 7(1)* is brought out onto (arrow m of FIG. 8A) first-tier standby table 51B (ST5). At this time, first engaging tool 52a is at retracted position H0 where first engaging tool 52a does not interfere with empty pallet 7(1)* to be brought out to first-tier standby table 51B. Then, second-tier standby table 51A is lowered down to (arrow n of FIG. 8B) the supply transfer height (ST6), and replenishment pallet 7(2) is brought onto (arrow p of FIG. 9A) supply table 61 (ST7).

At this time, first engaging tool 52a is at retracted position H0 or first-tier position H1 where first engaging tool 52a does not interfere with replenishment pallet 7(2) to be brought out to supply table 61. That is, second lifting mechanism 54 (second lift) moves first engaging mechanism 52 (first placing and withdrawing unit) to the retracted position (retracted position H0 and first-tier position H1) at which first engaging mechanism 52 does not interfere with pallet 7 when (before) second engaging mechanism 62 (second placing and withdrawing unit) places and withdraws pallet 7 (empty pallet 7(1)* and replenishment pallet 7(2)) on and from supply table 61 (ST5 and ST7). Retracted position H0 is a position below first-tier position H1 when first engaging mechanism 52 places and withdraws pallet 7 onto and from first-tier standby table 51B.

That is, retracted position H0 is a position below first-tier position H1 at which first engaging mechanism 52 (first placing and withdrawing unit) places and withdraws pallet 7 onto and from first-tier standby table 51B (bottommost standby table 51). In a case of a form where first engaging tool 52a of first engaging mechanism 52 engages with engaging portion 7a of the pallet from above, retracted position H0 is a position above second-tier position 112 at which first engaging mechanism 52 (first placing and withdrawing unit) places and withdraws pallet 7 onto and from second-tier standby table 51A (uppermost standby table 51). Accordingly, first engaging mechanism 52 can be prevented from interfering with pallet 7 that is placed and withdrawn by second engaging mechanism 62.

In addition, in a state where replenishment pallet 7(2) is held by second-tier standby table 51A, empty pallet 7(1)* held by supply table 61 is being brought out onto first-tier standby table 51B in (ST5). In addition, in a state where empty pallet 7(1)* is held by first-tier standby table 51B, replenishment pallet 7(2) held by second-tier standby table 51A is being brought onto supply table 61 in (ST7). That is, in a state where pallet 7 is held by standby table 51, which is one of the plurality of standby tables 51, pallet 7 is being placed and withdrawn between standby table 51, which is different from the above one standby table 51, and supply table 61. Accordingly, the time it takes for replacing pallet 7 reduces, and thus pallet 7 can be efficiently replaced.

Then, in FIG. 6, first engaging tool 52a is moved to (arrow q of FIG. 9A) first-tier position H1 (ST8). The up-and-down movement of first engaging tool 52a (ST8) may be executed in parallel with lowering second-tier standby table 51A (ST6) or bringing out replenishment pallet 7(2) (ST7). That is, placing and withdrawing pallet 7 (empty pallet 7(1)* and replenishment pallet 7(2)) onto and from supply table 61 performed by second engaging mechanism 62 (second placing and withdrawing unit) and the up-and-down movement of first engaging mechanism 52 (first placing and withdrawing unit) performed by second lifting mechanism 54 (second lift) may be carried out independently of each other. Accordingly, pallet 7 can be efficiently replaced.

Then, in FIG. 6, first-tier standby table 51B is moved up to (arrow r of FIG. 9B) the transfer height at which empty pallet 7(1)* is stored onto shelf 41(1) (ST9), and empty pallet 7(1)* is brought out onto (arrow s of FIG. 9B) shelf 41(1) of magazine 40 (ST10). As in the above description, emptied pallet 7 which is at the component supply position is sequentially replaced with pallet 7 for component replenishment stored in magazine 40.

As described above, in the pallet replacing method (component supplying method) of the exemplary embodiment, first engaging mechanism 52 (first placing and withdrawing unit) moves up and down between the plurality of standby tables 51 (second-tier standby table 51A and first-tier standby table 51B), and places and withdraws pallet 7 on each standby table 51 between magazine 40 and standby table 51. Accordingly, pallet 7 (tray 6) can be efficiently replaced without causing an increase in the size of component supplier 5.

Hereinbefore, descriptions have been made based on the exemplary embodiment of the present disclosure. It is clear for those skilled in the art that the exemplary embodiment can have various modification examples by each configuration element or each processing of the exemplary embodiment being combined and such modification examples also fall within the scope of the present disclosure.

In the following modification example, a component supplier and a component supplying method, in which a component can be efficiently picked up from a tray, will be described. Descriptions of parts which are the same as the aforementioned exemplary embodiment of the present disclosure will not be repeated.

Figure 12A:
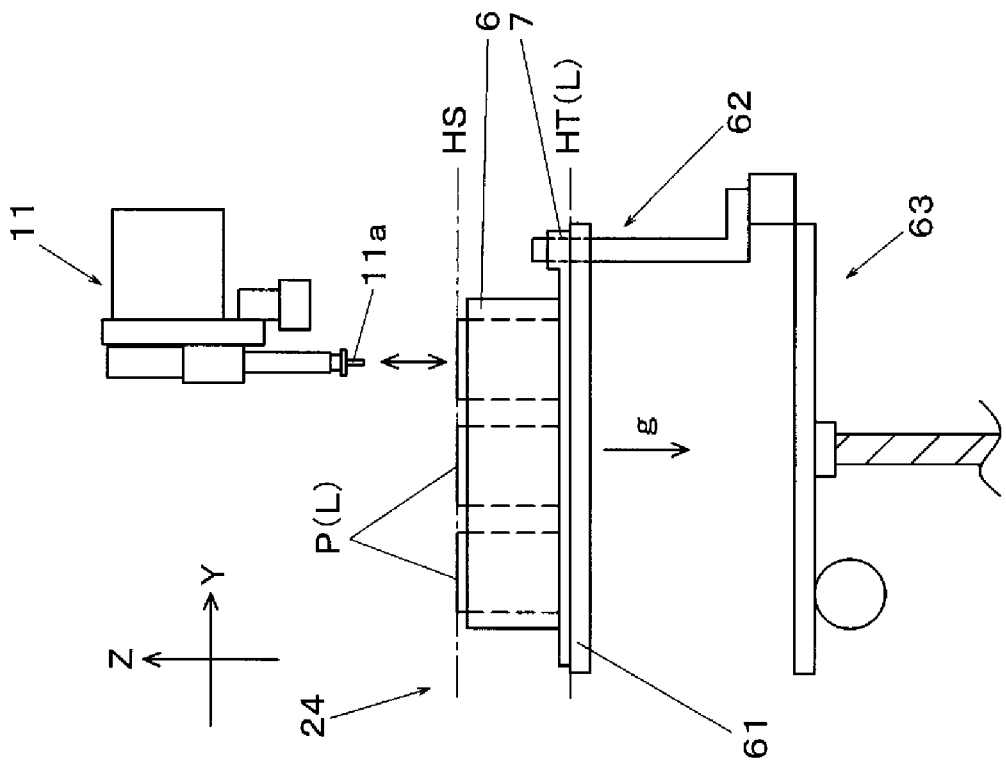
FIG. 12A is an explanatory view of supplying a component having a low height in the component supplier according to the modification example of the present disclosure.
Figure 12B:
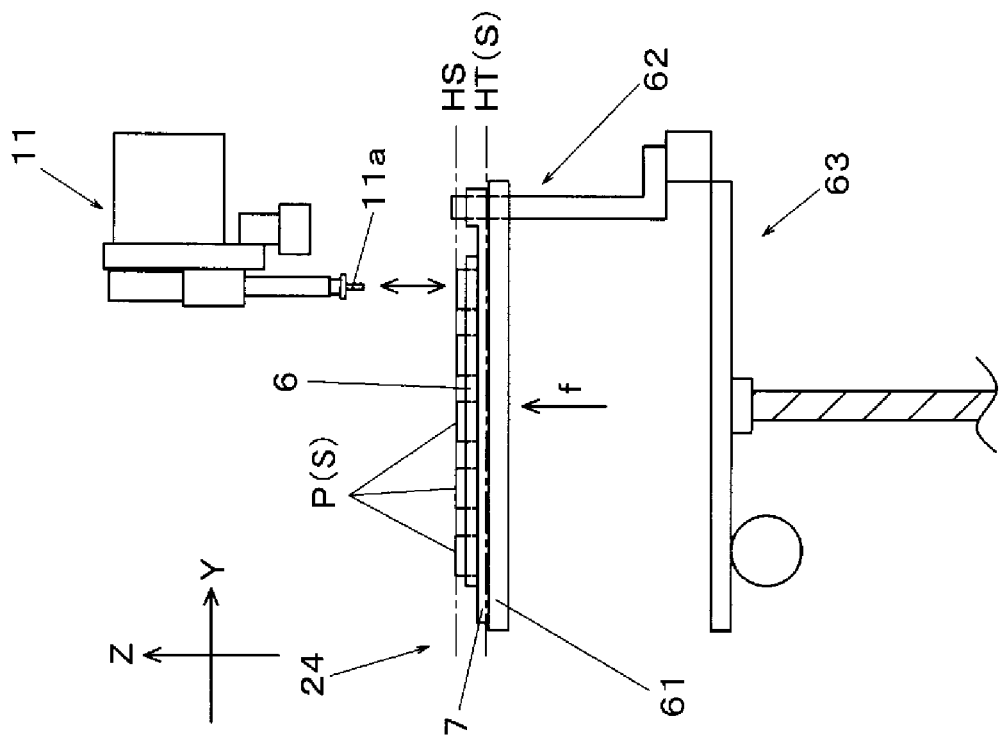
FIG. 12B is an explanatory view of supplying a component having a great height in the component supplier according to the modification example of the present disclosure.

In FIG. 12A and FIG. 12B, each holding head lifts and lowers suction nozzle 11a installed in a Z-direction. By suction nozzle 11a being lowered, component P supplied by component supplying units 4A and 4B is picked up and mounted on board 3. Thus, Y-axis beam 9, X-axis beam 10, and mounting head 11 configure the component mounting mechanism that mounts component P on board 3 by means of suction nozzle 11a.

Figure 10:
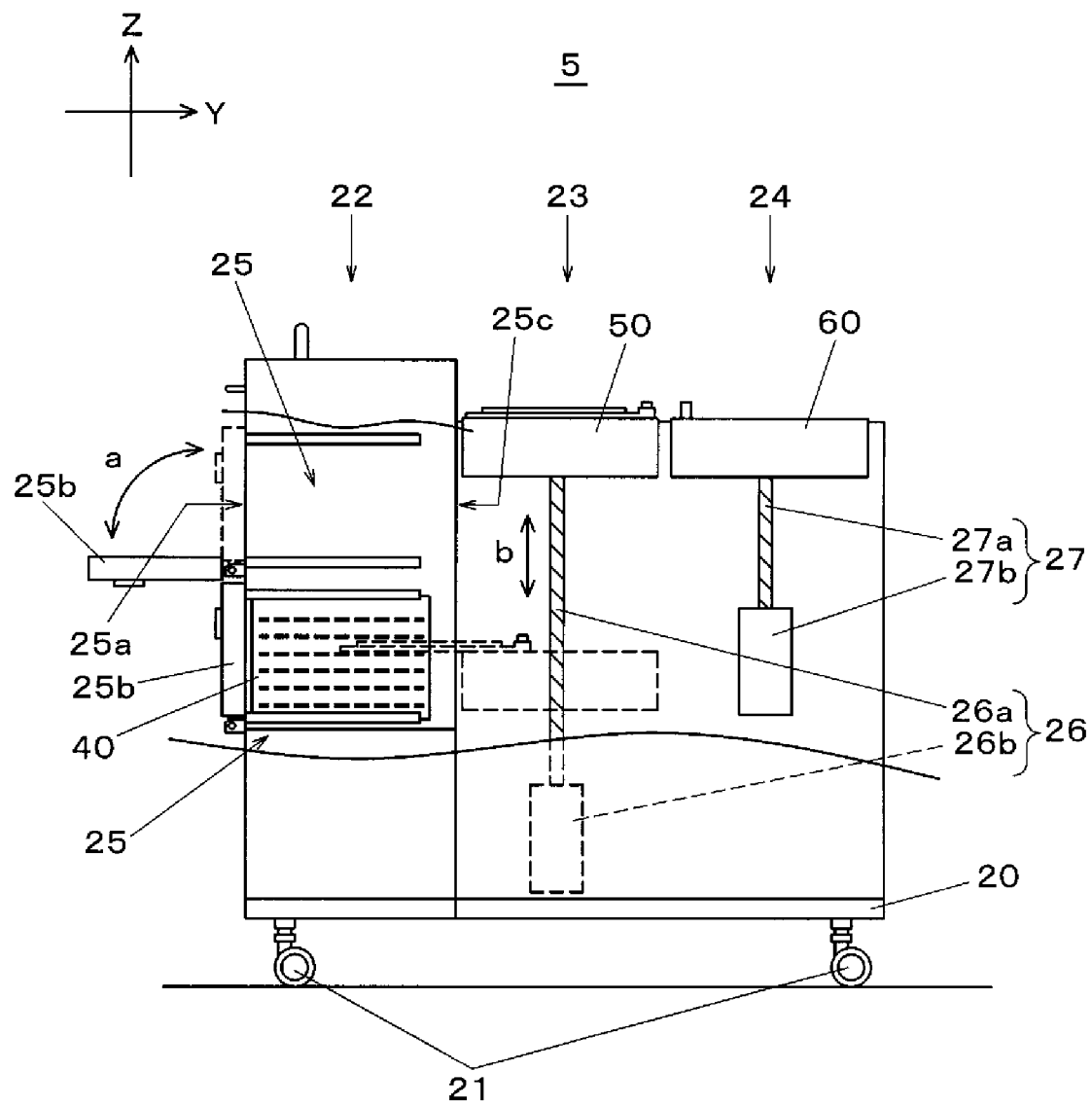
FIG. 10 is a configuration explanatory view of a component supplier according to a modification example of the present disclosure.

In FIG. 10, pallet standby unit 23 is provided in front of rack 22 (on the side opposite to the side where the user performs an operation), and is provided with table 50 and first lifting mechanism 26. First lifting mechanism 26 has ball screw 26a extended in the up-and-down direction and motor 26b that rotation-drives ball screw 26a. First lifting mechanism 26 drives motor 26b to lift and lower (arrow b) table 50. That is, first lifting mechanism 26 is the first lift that moves table 50 up and down.

Figure 11:
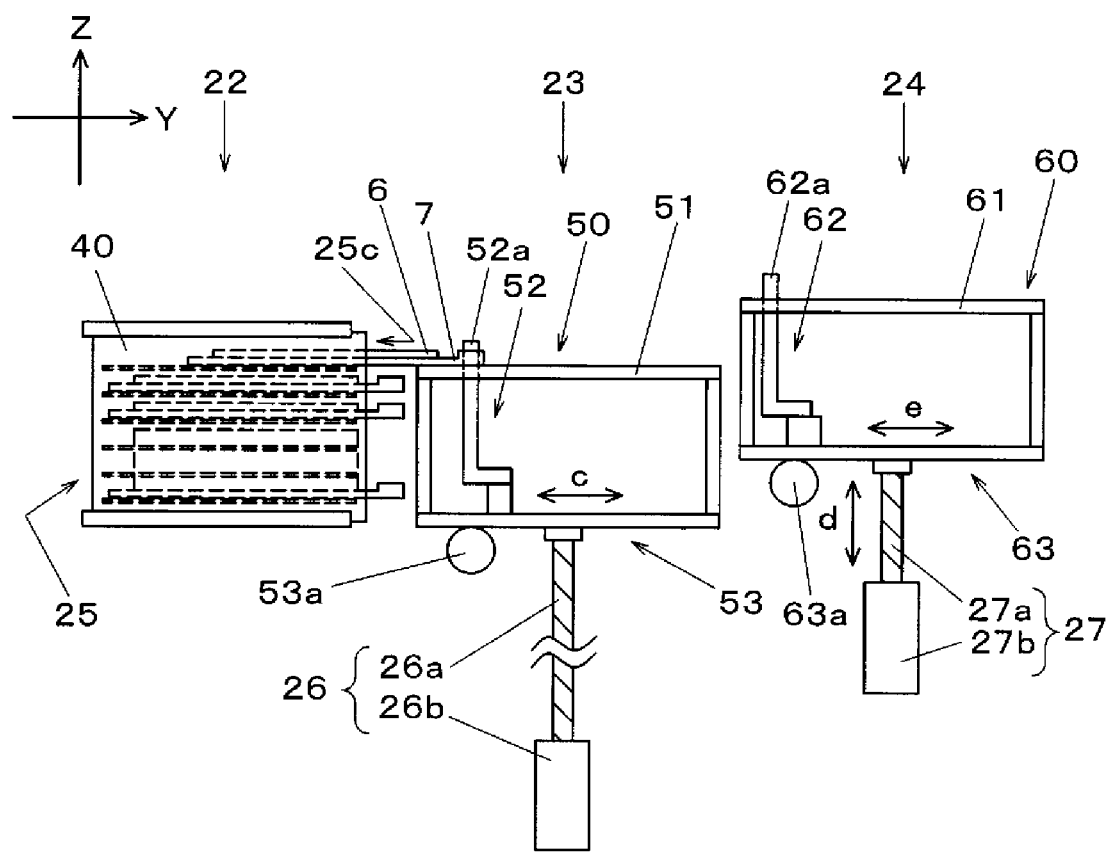
FIG. 11 is a partial configuration explanatory view of the component supplier according to the modification example of the present disclosure.

In FIG. 11, table 50 is provided with standby table 51 and first engaging mechanism 52. Transferred pallet 7 is held by an upper surface of standby table 51. Pallet standby unit 23 is provided with table 50 that has standby table 51 provided in front of magazine 40. Table 50 has first engaging mechanism 52 (first placing and withdrawing unit) that picks up pallet 7 between magazine 40 and standby table 51.

In FIG. 11, pallet supplier 24 is provided in front of pallet standby unit 23 (on the side opposite to the side where the user performs an operation), and is provided with supplier 60 and second lifting mechanism 27. Second lifting mechanism 27 has ball screw 27a extended in the up-and-down direction and motor 27b that rotation-drives ball screw 27a. Second lifting mechanism 27 drives motor 27b to lift and lower (arrow d) table 60. That is, second lifting mechanism 27 is the second lift that moves supplier 60 up and down.

In FIG. 11, supplier 60 is provided with supply table 61 and second engaging mechanism 62. Supply table 61 holds pallet 7 received from standby table 51 of table 50 at the component supply position where component P is supplied.

Hereinafter, a method for changing the height of supply table 61 corresponding to component P supplied to the component supply position and technical implication thereof will be described with reference to FIG. 12A and FIG. 12B. FIG. 12A illustrates a state of pallet supplier 24 on which component P(S) having a low height is supplied at the component supply position. FIG. 12B illustrates a state of pallet supplier 24 on which component P(L) having a great height is supplied at the component supply position. Regardless of the shape of component P supplied to the component supply position, pallet supplier 24 changes the height of the upper surface of supply table 61 (supply transfer height HT) such that suction height HS at which component P is sucked and picked up from tray 6 by suction nozzle 11a is constant.

That is, second lifting mechanism 27 (second lift) moves supply table 61 such that the height position of the upper surface of component P is a predetermined height (component suction height HS) corresponding to the shape of component P supplied to the component supply position. Specifically, in the case of component P(S) having a low height, pallet supplier 24 holds pallet 7 at supply transfer height HT(S) to which supply table 61 is lifted (arrow f). In the case of component P(L) having a great height, pallet supplier 24 holds pallet 7 at supply transfer height HT(L) to which supply table 61 is lowered (arrow g).

Accordingly, even when component P varies in shape and size, suction nozzle 11a can pick up component P at suction height HS as usual, thereby simplifying the control of picking up component P. In addition, since the downward stroke of suction nozzle 11a is not required to be greater in accordance with component P(S) having a low height, component mounting efficiency can be improved by reducing the time it takes to lower suction nozzle 11a.

Pallet supplier 24 is provided in front of table 50, and is provided with supplier 60 that has supply table 61 which holds pallet 7 at the component supply position where component P is supplied. Supply table 61 has second engaging mechanism 62 (second placing and withdrawing unit) that places and withdraws pallet 7 between standby table 51 and supply table 61.

Hereinafter, the configuration of a control system of component supplier 5 will be described. Component supplier 5 is provided with controller 30 and storage 31. Based on a work parameter stored in storage 31, controller 30 controls motor 26b, motor 27b, motor 53a, and motor 63a to execute the replacement of pallet 7 at the component supply position.

In a state where component supplier 5 is installed in component mounter 1, the controller exchanges information for adjusting the height of supply table 61 with the mounting controller (not illustrated) provided in component mounter 1. The controller supplies component P required by component mounter 1 to the component supply position by exchanging a signal with the mounting controller. In addition, the controller receives information for adjusting the height of supply table 61, including the height of component P and the thickness of the tray, from the mounting controller, and changes the height of supply table 61 (supply transfer height HT).

Hereinafter, with reference to FIG. 14A to FIG. 15B, a pallet supplying method (component supplying method) in which component P is supplied by pallet 7 being supplied to the component supply position in component supplier 5 will be described in accordance with a flow of FIG. 13. In FIG. 14A, six tiers of shelves 41(1) to 41(6) are provided in the up-and-down direction in magazine 40 held by magazine holder 25. Pallets 7(1) to 7(3), on which trays 6(1) to 6(3) storing component P(S) having a low height are installed, are stored on upper shelves 41(1) to 41(3). Pallet 7(6), on which tray 6(6) storing component P(H) having a great height is installed, is stored on the lowest shelf 41(6). Pallet 7(6) also occupies shelves 41(4) and 41(5).

In addition, pallet 7 is not at the component supply position of supply table 61, and the height of supply table 61 is set at supply transfer height HT(S) corresponding to component P(S) having a low height. From this state, the pallet supplying method in which pallet 7(6) for component replenishment (hereinafter, referred to as "replenishment pallet 7(6)".) stored on shelf 41(6) is supplied to the component supply position will be described.

Figure 13:
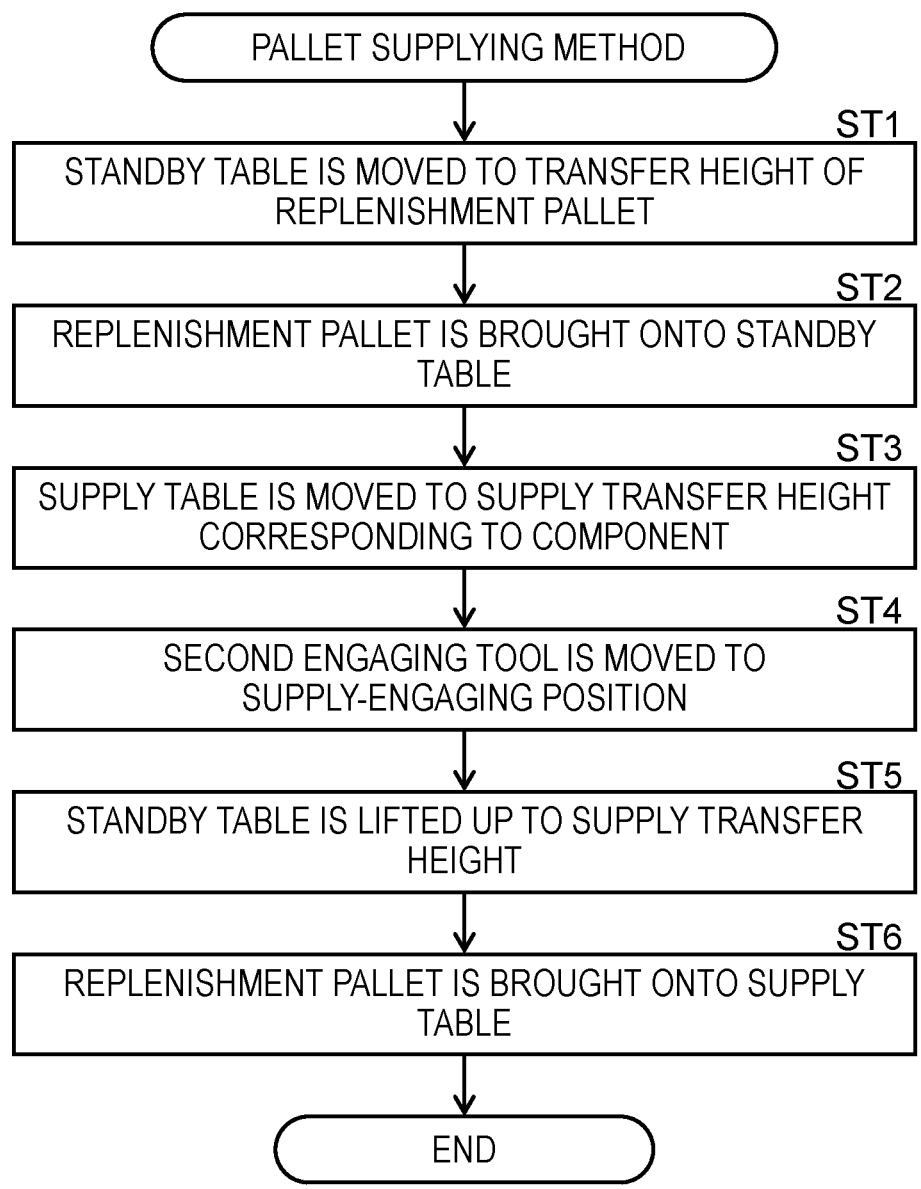
FIG. 13 is a flow chart showing a pallet supplying method in the component supplier according to the modification example of the present disclosure.
Figure 14A:
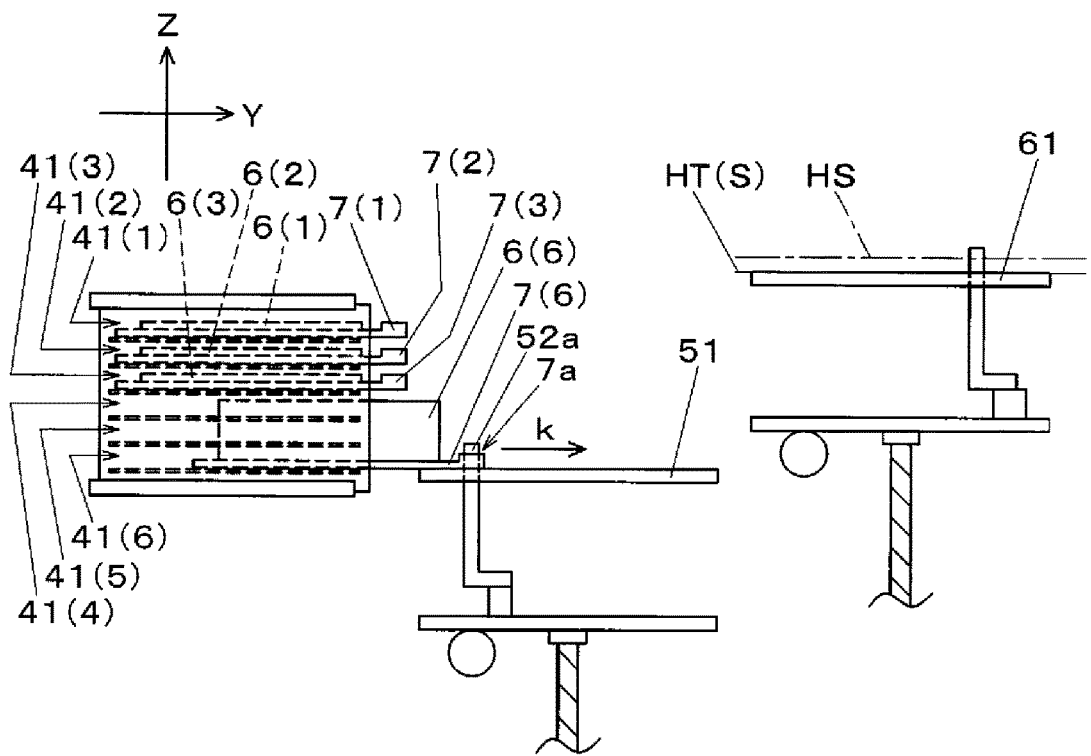
FIG. 14A is a process diagram showing the pallet supplying method in the component supplier according to the modification example of the present disclosure.
Figure 14B:
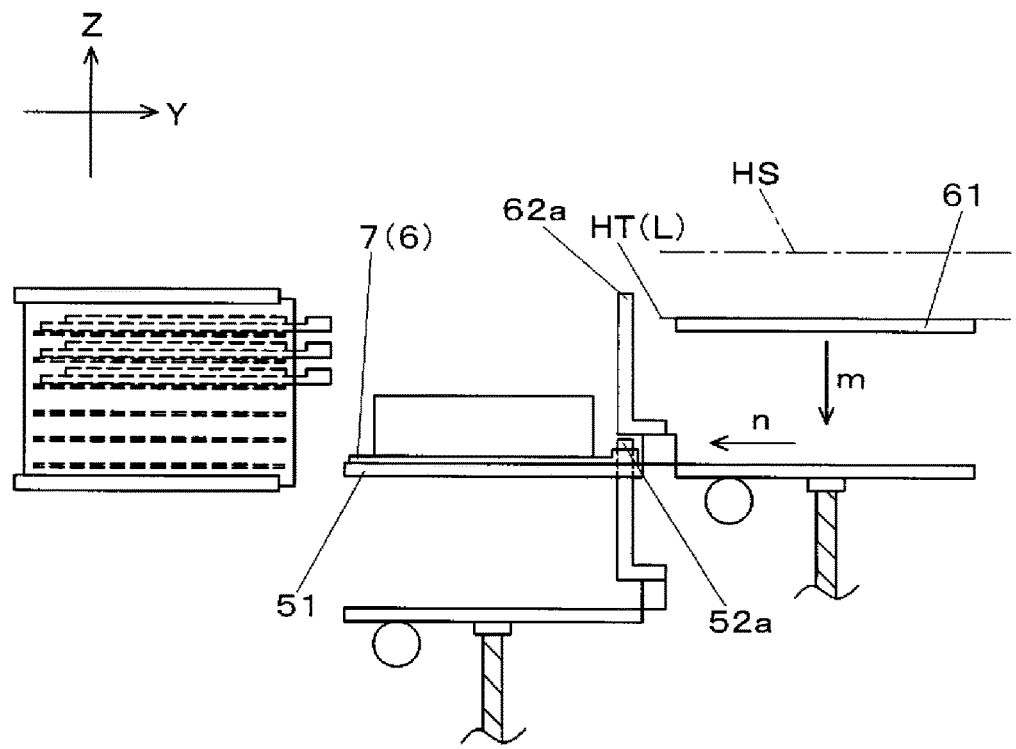
FIG. 14B is a process diagram showing the pallet supplying method in the component supplier according to the modification example of the present disclosure.
Figure 15A:
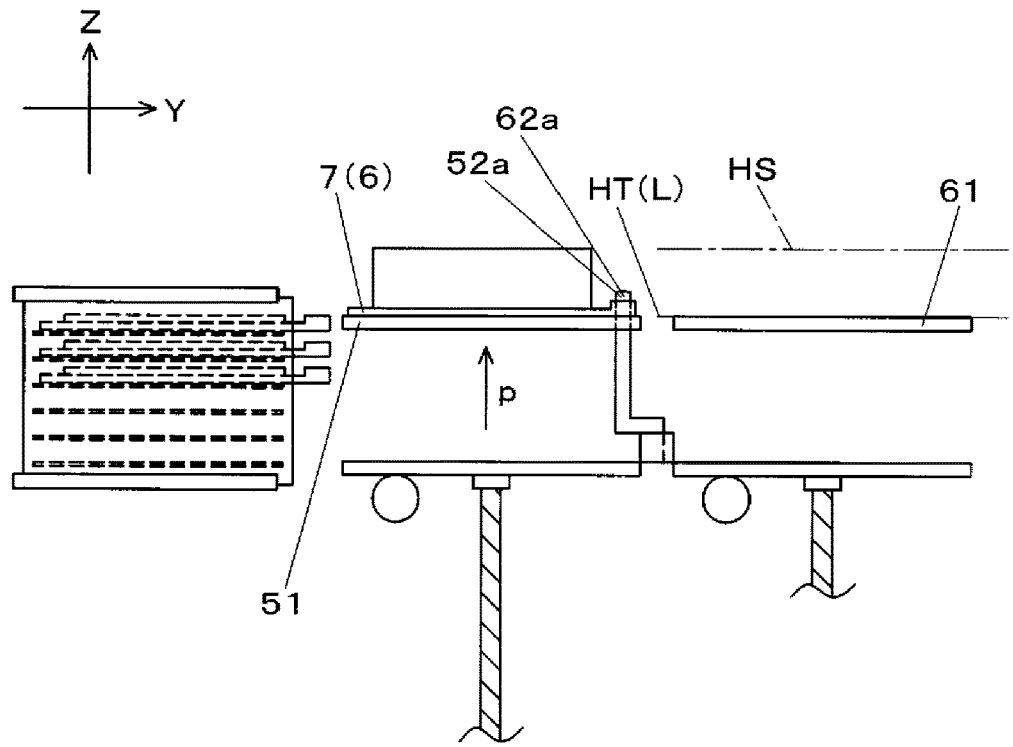
FIG. 15A is a process diagram showing the pallet supplying method in the component supplier according to the modification example of the present disclosure.
Figure 15B:
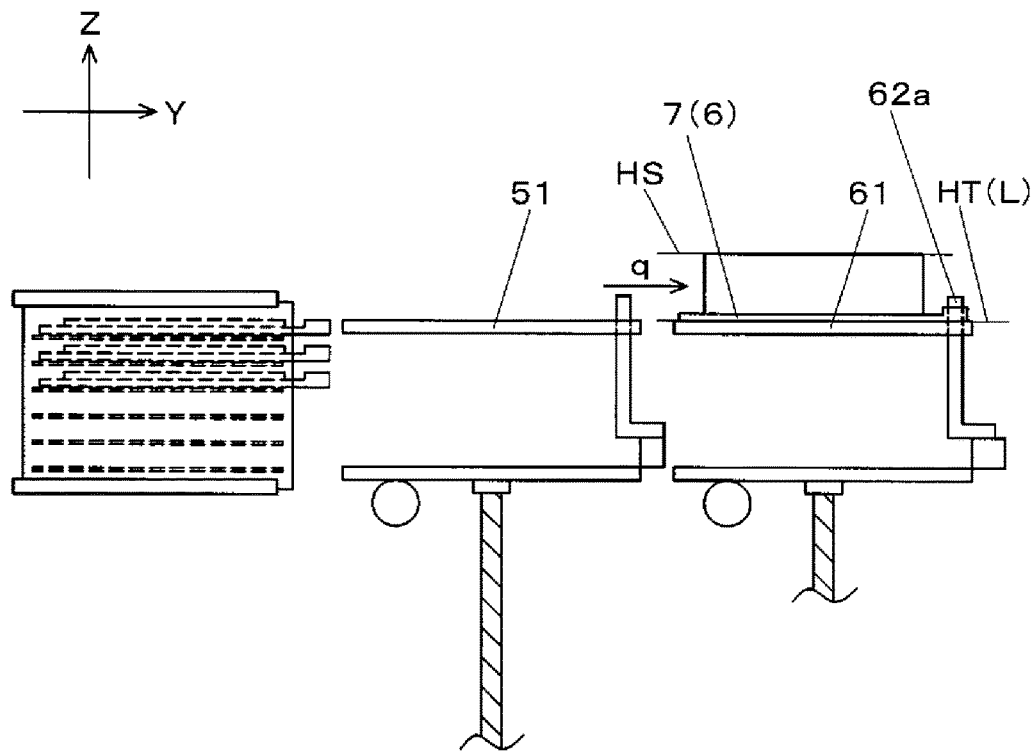
FIG. 15B is a process diagram showing the pallet supplying method in the component supplier according to the modification example of the present disclosure.

In FIG. 13, standby table 51 is moved to the transfer height at which replenishment pallet 7(6) is withdrawn from shelf 41(6) (ST1). Then, first engaging tool 52a is engaged with engaging portion 7a of replenishment pallet 7(6), and replenishment pallet 7(6) is brought onto (arrow k of FIG. 14A) a standby position of standby table 51 (ST2). Then, supply table 61 is moved to (arrow m of FIG. 14B) supply transfer height HT(L) corresponding to component P(L) (ST3). Then, second engaging tool 62a is moved to (arrow n of FIG. 14B) a supply-engaging position at which second engaging tool 62a can be engaged with engaging portion 7a of replenishment pallet 7(6) that is at the standby position (ST4).

Then, standby table 51 is lifted up to (arrow p of FIG. 15A) supply transfer height HT(L) at which replenishment pallet 7(6) is exchanged between standby table 51 and supply table 61 (ST5). Then, replenishment pallet 7(6) is brought onto (arrow q of FIG. 15B) supply table 61 (ST6). After then, once pallet 7(6), which is at the component supply position, is stored into magazine 40, the height of supply table 61 (supply transfer height HT) is changed so as to correspond to component P of next pallet 7 for component replenishment, and next pallet 7 for component supply is supplied to the component supply position.

As described above, in the pallet supplying method (component supplying method) of the exemplary embodiment, supply table 61 is moved to a predetermined height (supply transfer height HT) corresponding to component P stored on tray 6 installed on pallet 7 held by standby table 51, and standby table 51 is moved to a height (supply transfer height HT) at which second engaging mechanism 62 (second placing and withdrawing unit) places and withdraws pallet 7 onto and from standby table 51. Accordingly, suction nozzle 11a can efficiently pick up component P from tray 6.

INDUSTRIAL APPLICABILITY

The component supplier and the component supplying method of the present disclosure are effective in that the tray can be efficiently replaced without causing an increase in size of the device, and are useful in the field of component mounting, which is mounting a component on a board.

What is claimed is:

1. A component supplier comprising:
    a magazine that stacks and stores a plurality of pallets on which a tray storing a component is installed;
    a table that is provided in front of the magazine and is provided with a plurality of standby tables in multiple tiers in an up-and-down direction;
    a first lift that moves the table up and down; and
    a pallet supplier that is provided in front of the table and that includes a supply table which holds at least one of the plurality of pallets at a component supply position where the component is supplied,
    wherein the table includes
        a first placing and withdrawing unit that places and withdraws the at least one of the plurality of pallets between the magazine and the plurality of standby tables, and
        a second lift that moves the first placing and withdrawing unit up and down, and
    the pallet supplier includes a second placing and withdrawing unit that places and withdraws the at least one of the plurality of pallets between the plurality of standby tables and the supply table.

2. The component supplier of claim 1,
    wherein the second lift moves the first placing and withdrawing unit to a retracted position at which the first placing and withdrawing unit does not interfere with the at least one of the plurality of pallets when the second placing and withdrawing unit places and withdraws the at least one of the plurality of pallets.

3. The component supplier of claim 2,
    wherein out of the plurality of standby tables, the uppermost standby table is a first standby table,
    out of the plurality of standby tables, the bottommost standby table is a second standby table, and
    the retracted position is a position above a position at which the first placing and withdrawing unit places and withdraws the at least one of the plurality of pallets onto and from the first standby table, or a position below a position at which the first placing and withdrawing unit places and withdraws the at least one of the plurality of pallets onto and from the second standby table.

4. The component supplier of claim 1,
    wherein up-and-down movement of the table performed by the first lift and up-and-down movement of the first placing and withdrawing unit performed by the second lift are carried out independently of each other.

5. The component supplier of claim 1,
    wherein placing and withdrawing of the pallet performed by the second placing and withdrawing unit and up-and-down movement of the first placing and withdrawing unit performed by the second lift are carried out independently of each other.

* * * * *